(12) United States Patent
Cernasov et al.

(10) Patent No.: US 7,297,929 B2
(45) Date of Patent: Nov. 20, 2007

(54) LIGHT SENSOR AND PROCESSOR INCORPORATING HISTORICAL READINGS

(75) Inventors: Andrei Cernasov, Ringwood, NJ (US);
Fernando R. De La Vega, Ridgefield Park, NJ (US); Donald J. Porawski, Cedar Grove, NJ (US)

(73) Assignee: Honeywell International, Inc., Morristown, NJ (US)

( * ) Notice: Subject to any disclaimer, the term of this patent is extended or adjusted under 35 U.S.C. 154(b) by 20 days.

(21) Appl. No.: 11/375,008

(22) Filed: Mar. 15, 2006

(65) Prior Publication Data
US 2007/0215794 A1 Sep. 20, 2007

(51) Int. Cl.
*H01J 40/14* (2006.01)

(52) U.S. Cl. .............................. 250/221; 250/214 AL; 250/214 R

(58) Field of Classification Search .............. 250/221, 250/214 AL, 214 R, 214 P, 214 D, 214.1, 250/208.1; 340/539.26, 541, 555, 556, 557; 356/619, 620, 219, 221, 222; 396/98, 108, 396/323, 335
See application file for complete search history.

(56) References Cited

U.S. PATENT DOCUMENTS

| | | | |
|---|---|---|---|
| 4,329,581 A | 5/1982 | Helfrich, Jr. et al. | |
| 5,329,295 A | 7/1994 | Medin et al. | |
| 5,359,577 A | 10/1994 | Hoshino et al. | |
| 5,491,330 A | 2/1996 | Sato et al. | |
| 5,701,058 A | 12/1997 | Roth | |
| 5,910,653 A | 6/1999 | Campo | |
| 5,932,861 A | 8/1999 | Iwaguchi et al. | |
| D435,473 S | 12/2000 | Eckel et al. | |
| 6,396,040 B1 | 5/2002 | Hill | |
| 6,507,286 B2 | 1/2003 | Weindorf et al. | |
| 6,687,515 B1 | 2/2004 | Kosaka | |
| 6,806,485 B2 | 10/2004 | Jackson, Jr. | |
| 2002/0084404 A1 | 7/2002 | Jackson | |
| 2002/0101166 A1 | 8/2002 | Weindorf et al. | |
| 2006/0132635 A1* | 6/2006 | Land ........................... 348/311 |

* cited by examiner

*Primary Examiner*—Que T Le
(74) *Attorney, Agent, or Firm*—Ingrassia Fisher & Lorenz

(57) ABSTRACT

A sensor includes a light detector for dividing light in an environment into optical zones and detecting light from the optical zones. The sensor also includes a processor coupled to the light detector; and a memory coupled to the processor for storing the detected light as historic light readings.

21 Claims, 8 Drawing Sheets

ND PROCESSOR
LIGHT SENSOR AND PROCESSOR INCORPORATING HISTORICAL READINGS

FIELD

Embodiments generally relate to methods and apparatus for detecting light.

BACKGROUND

Typically, conventional ambient light sensors consist of a reversed biased photodiode, an amplifier, and an analog to digital converter (ADC). FIG. 1 is a schematic diagram illustrating a conventional ambient light sensor 100. Ambient light sensor 100 includes a reversed biased photodiode 102 for detecting light 104 that strikes ambient light sensor 100. Photodiode 102 is coupled to a voltage source 106 and a resistor 108. Resistor 106 is coupled to ground.

Ambient light sensor 100 also includes an amplifier 110 coupled to photodiode 102. Amplifier 110 amplifies the signal from photodiode 102. Ambient light sensor 100 also includes an analog to digital converter (ADC) 112 coupled to amplifier 108. ADC 112 converts the analog signal from amplifier into a digital signal for further processing. The spectral response of the photodiodes, such as photodiode 102, may be tuned, to the extent possible by the photodiode, to mimic the spectral response of the human eye.

Ambient light sensors, such as sensor 100, may be incorporated into electronic devices such as televisions, computer monitors, and cell phones. In these devices, ambient light sensors provide environmental illumination information to backlight controllers or front light controllers of displays in the electronic devices. The information provided by the ambient light sensors assists in determining the brightness of the display in these devices. For example, if the ambient light sensor detects that the environmental illumination conditions are bright (e.g. a cell phone outside on a sunny day), the brightness of the display may be increased so that images on the displays may be viewable in the bright environmental conditions.

These ambient light sensors, however, as designed to assume only homogeneous and static environmental illumination conditions. That is, these sensors assume that light from all angles is the same and the light does not change quickly over time. Because the ambient light sensors assume such illumination conditions, these sensors do not detect light well in settings where the intensity and direction of light may change rapidly, for example, within seconds or less. As such, these ambient light sensors are not suitable for devices such as avionics displays where lighting conditions may change rapidly. For example, fighter jets make rapid movements during flight, especially during combat. As such, the lighting conditions inside the cockpit of jet change rapidly as the jet maneuvers.

Additionally, these ambient light sensors are not designed to account for certain conditions of the human eye, such as behavior of the eye when exposed to flashes of light, the dependence of eye sensitivity to illumination history, the response of the eye to extremely patterned light, and the adaptation of the eye to contrast. As such, these ambient light sensors are not suitable where these conditions may be a factor.

SUMMARY

An embodiment of the invention concerns a sensor. The sensor includes a light detector for dividing light in an environment into optical zones and detecting light from the optical zones. The sensor also includes a processor coupled to the light detector. The processor is configured to determine characteristics of the optical zones based on the detected light. The sensor also includes a memory coupled to the processor for storing the detected light as historic light readings.

Another embodiment of the invention concerns a method for detecting light. The method includes detecting light from an environment by dividing the light into optical zone and storing the detected light as historic light readings for the optical zones. The method also includes determining a luminosity of a light source based on the historic light readings.

Yet another embodiment of invention concerns a sensor. The sensor includes means for dividing an ambient environment into optical zones and means for detecting light from the optical zones positioned adjacent to the dividing means. The sensor also includes means for processing the detected light coupled to the detecting means and means for storing the detected light as historic light readings coupled to the processing means.

Additional embodiments will be set forth in part in the description which follows, and in part will be obvious from the description, or may be learned by practice of the invention. The embodiments will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

DETAILED DESCRIPTION

Figure 1:
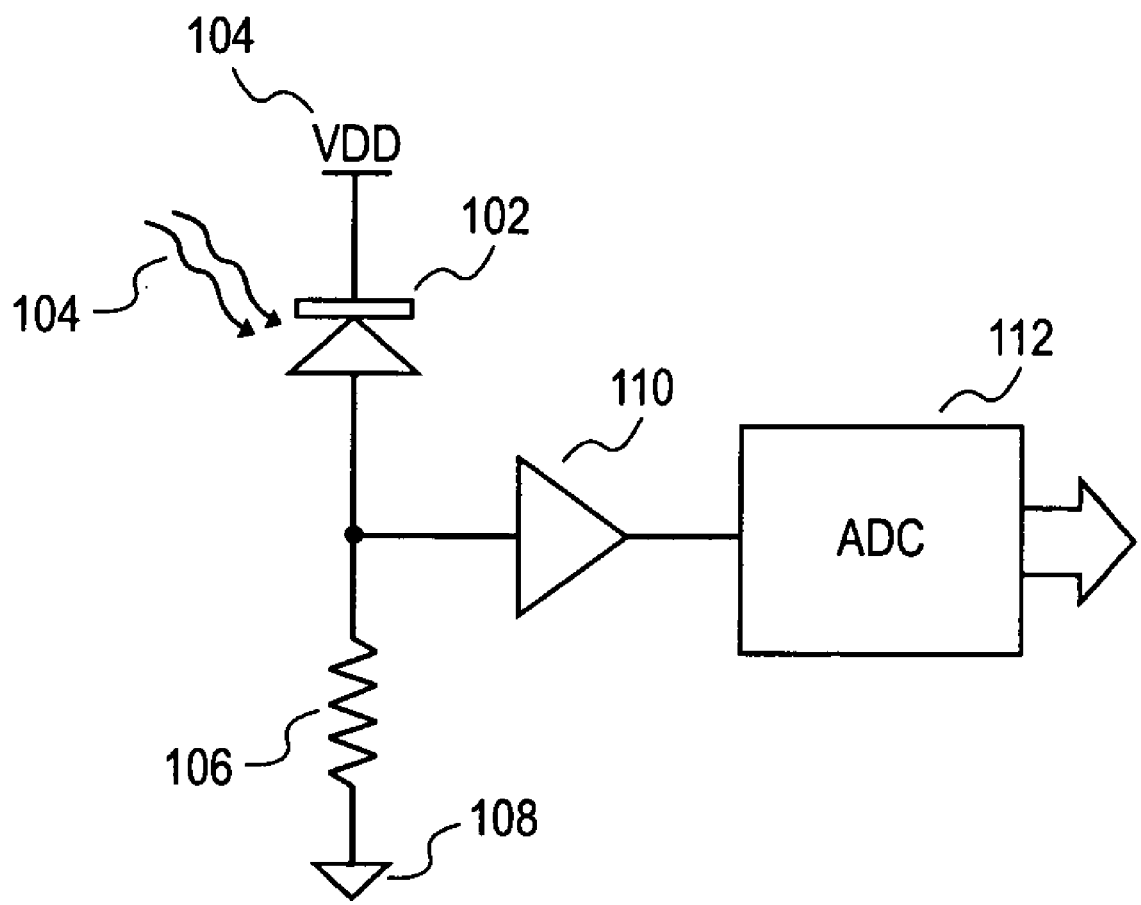
FIG. 1 is a diagram illustrating a conventional ambient light sensor.

Embodiments of the invention are directed to a light sensor and a light sensing method. Accordingly to embodiments, the light sensor includes a multi-element light detector for detecting light in multiple optical zones in the environment. The multi-element light detector allows the light sensor to detect light in the optical zones and determine the characteristics of the environmental illumination conditions for each optical zone.

Specifically, the multi-element light detector divides the environment into optical zones so that illumination conditions for each zone may be considered instead of considering the environment as a whole. By dividing the environment into optical zones, the light sensor may detect the environmental illumination conditions for the different optical zones. As such, the light sensor may determine the characteristics of the environmental illumination conditions for each optical zone.

For example, the light sensor may determine the spatial characteristics of the environmental illumination conditions. The light sensor may determine the spatial distribution of light, spatial differentials of the environmental illumination conditions, and the spatial density of the environmental illumination conditions.

Further, the light sensor stores the detected light in memory as historic data for the different optical zones. The light sensor may use the historic data to determine temporal characteristics of the environmental illumination conditions. For example, the light sensor may determine the rate of change in the illumination levels. Also, the historic data may be used to determine the spatial characteristics of the environmental illumination conditions over time.

Further, the light sensor may use the detected environmental illumination conditions to determine the behavior of the human eye to these conditions. The light sensor may apply the environmental illumination conditions to models of human eye behavior. For example, the light sensor may use such models as Ricco's law, Bloch's law, Weber's law, Broca-Sulzer effect, Ferry-Porter Law, and Brucke-Bartley Effect. Also, the light sensor may use viewer specific metrics such as eye mobility, tolerances to visual excitations, and time constants.

The light sensor may be used with electronic devices, which include displays, such as televisions, cell phones, cameras, avionic devices, and computer displays. The light sensor, when coupled to these electronic devices, uses the detected light from the optical zones to determine the brightness for the displays. The light sensor assists in determining the driving signal of the display by applying the historic data, the modeled eye behavior, spatial conditions of the environment, or temporal conditions of the environment to determine the display brightness best suited for the environmental conditions.

By detecting light in optical zones instead of the whole environment, the light sensor may detect the environmental illumination conditions for non-homogenous illumination conditions. Further, by storing the detected illumination conditions over time, the light sensor may detect illumination conditions that change rapidly. This allows the light sensor to detect light well in settings where the intensity and direction of light may change rapidly. Further, by determining human eye behavior in response to the illumination conditions, the light sensor may assist electronic devices to display images tailored to the human user and environment.

Reference will now be made in detail to embodiments of the invention, examples of which are illustrated in the accompanying drawings. Wherever possible, the same reference numbers will be used throughout the drawings to refer to the same or like parts.

Figure 2:
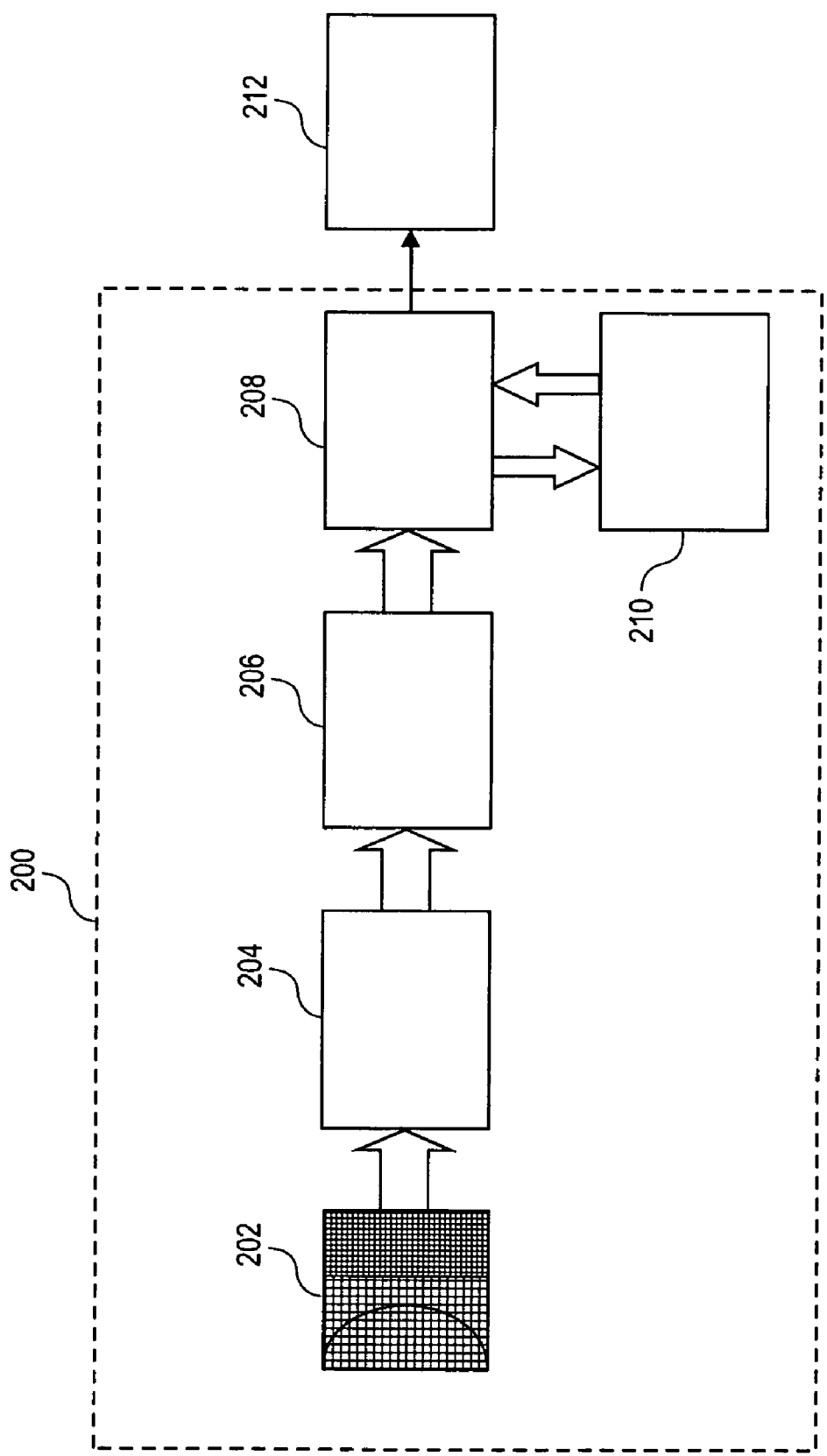
FIG. 2 is a diagram illustrating a sensor consistent with embodiments of the invention.

FIG. 2 is a diagram illustrating a light sensor 200 consistent with embodiments. One skilled in the art will realize that light sensor 200 illustrated in FIG. 2 is a generalized diagram and that other components may be added or existing components may be removed or modified.

Light sensor 200 may be used in various types of electronic devices such as televisions, camera, computer displays, avionics controls, and cell phones. Light sensor 200 may be used to detect the environmental illumination conditions in which the electronic devices are located. One skilled in the art will realize that light sensor 200 may be used with any type of electronic device.

Light sensor 200 may be used in these electronic devices to determine the lighting conditions of a display of the electronic devices. For example, as illustrated in FIG. 2, light sensor 200 may be coupled to display driver 212. Light sensor 200 may provide display driver 212 with information regarding the environmental illumination conditions. Display driver 212 may use the information to power the display at appropriate levels for the environmental illumination conditions.

Additionally, light sensor 200 may be independently housed. As such, light sensor may be coupled to these electronic devices though a typical input/output connection.

As shown in FIG. 2, light sensor 200 includes a multi-element sensor 202 for detecting light that strikes light sensor 200. Multi-element sensor 202 includes multiple light detector elements for detecting light at wide angles and in multiple optical zones.

Multi-element sensor 202 may include any number of light detector elements for detecting light at wide angles and in multiple optical zones. The multiple light detector elements are divided into optical zones. Each light detector element would detect light from different optical zones in the environment, which would represent an illumination zone. The light detector elements would detect the illumination information for the environment for optical zone. Examples of illumination information may be brightness, color, direction, or combination thereof.

The multiple light detector elements of multi-element sensor 202 may be arranged in any pattern to cover the wide angles and multiple optical zones. For example, the light detector elements may be arranged in an array of elements in order to detect light from different angles and for different optical zones.

The light detector elements may be any hardware, software, or combination thereof for detecting light. For example, light detector elements may be semiconductor light detectors such as photodiodes or reverse-biased photodiodes. One skilled in the art will realize that light detector elements may be any type of device capable of detecting light.

Additionally, multi-element sensor 202 may include optics to focus the light on the multiple light detector elements. Within each illumination zone, the optics may be non-imaging. For example, multi-element sensor 202 may include a lens for focusing light from different angles onto the different light detector elements.

FIGS. 3A, 3B, 4, 5, 6, and 7 (described below) are diagrams illustrating several exemplary multi-element sensors that may be used as multi-element sensor 202. One skilled in the art will realize that multi-element sensors illustrated in FIGS. 3A, 3B, 4, 5, 6, and 7 are generalized diagrams and that other components may be added or existing components may be removed or modified.

Figure 3B:
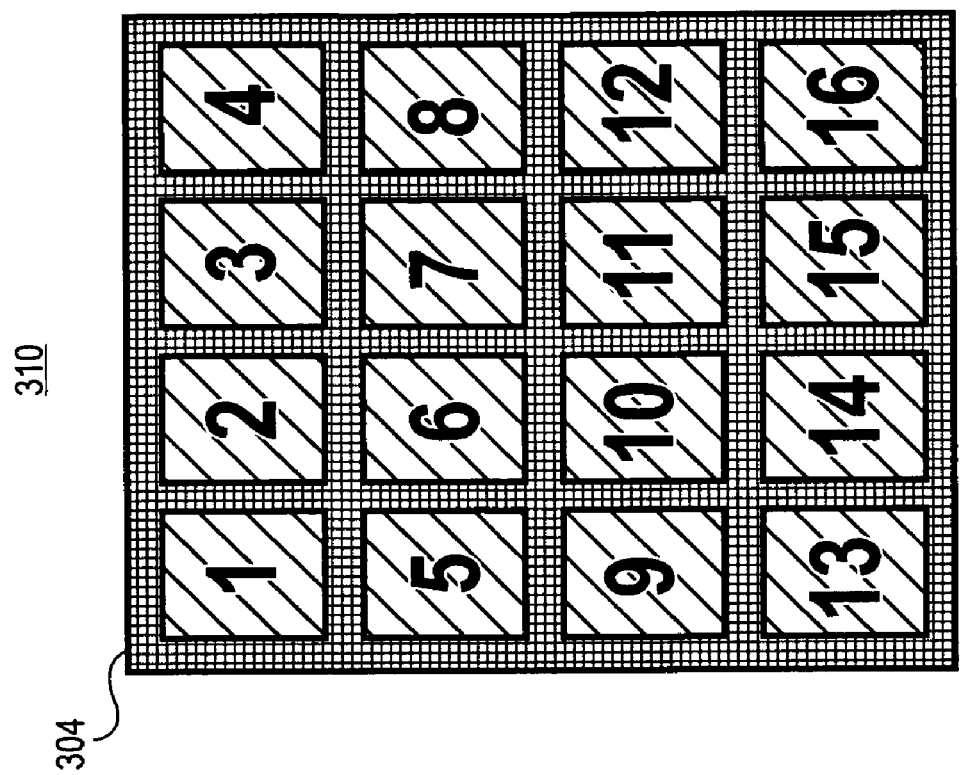
FIGS. 3A and 3B are diagrams illustrating arrangements of a multi-element sensor consistent with embodiments of the invention.
Figure 3A:
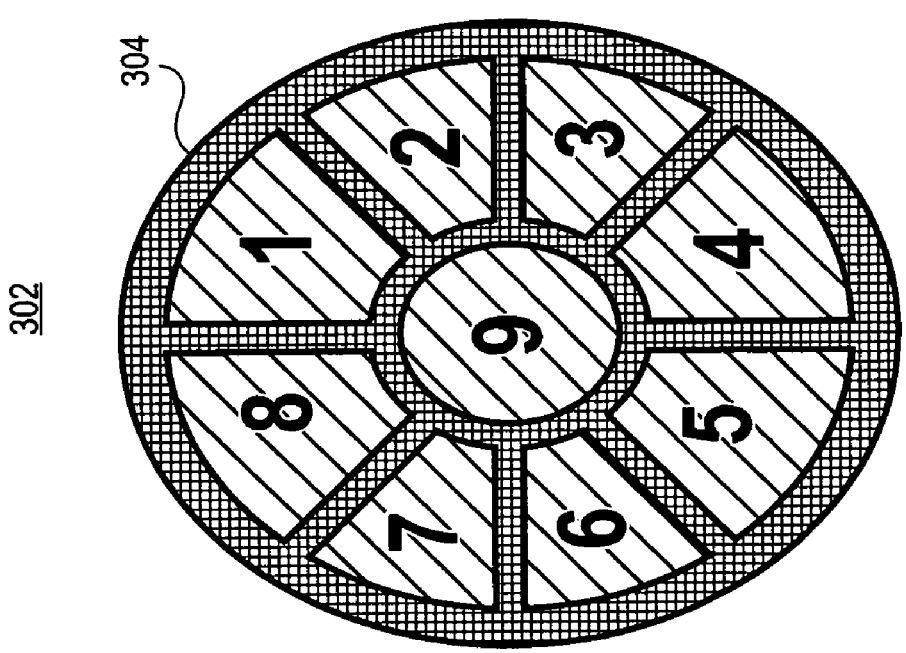

FIGS. 3A and 3B illustrates two examples of the arrangement of the multiple detector elements in a multi-element sensor 202. FIG. 3A illustrates an arrangement 302 in which the multiple detector elements 304 may be arranged in a circular pattern. As shown in FIG. 3A, detector elements 304 are arranged in a circular pattern with eight detector elements arranged around one detector element. The different detector elements 304 detect light from different optical zones in the environment.

FIG. 3B illustrates another arrangement 310 in which multiple elements may be arranged in a square array. As shown in FIG. 3B, light detector elements 304 are arranged in a four by four square array. The different light detector elements 304 detect light from different optical zones in the environment.

In both arrangement 302 and 310, each light detector element may be composed of a single or multiple light detectors. For example, each light detector element may be composed of a single or multiple semiconductor light detectors such as photodiodes or reverse-biased photodiodes and associated hardware.

Figure 4:
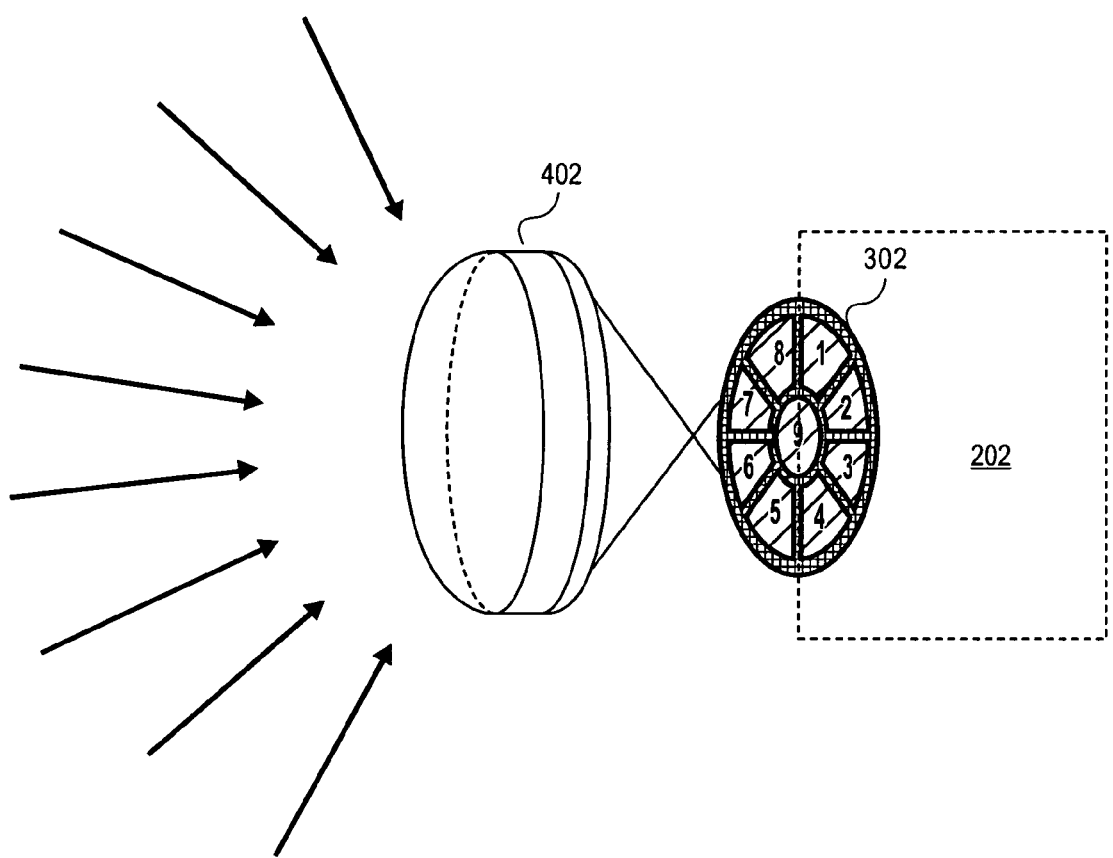
FIGS. 4, 5, and 6 are diagrams illustrating an optical arrangement for a multi-element sensor consistent with embodiments of the invention.
Figure 5:
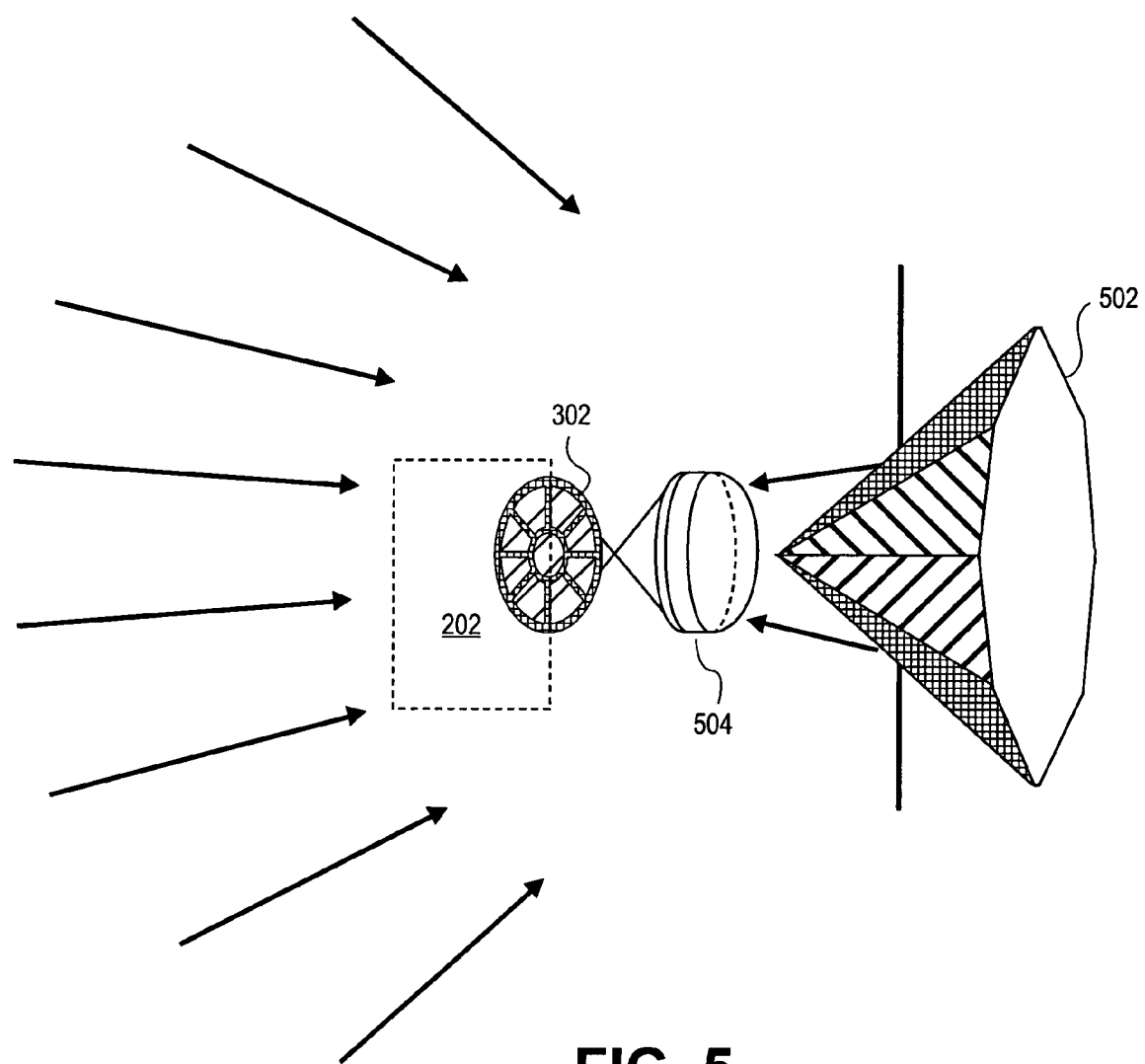
Figure 6:
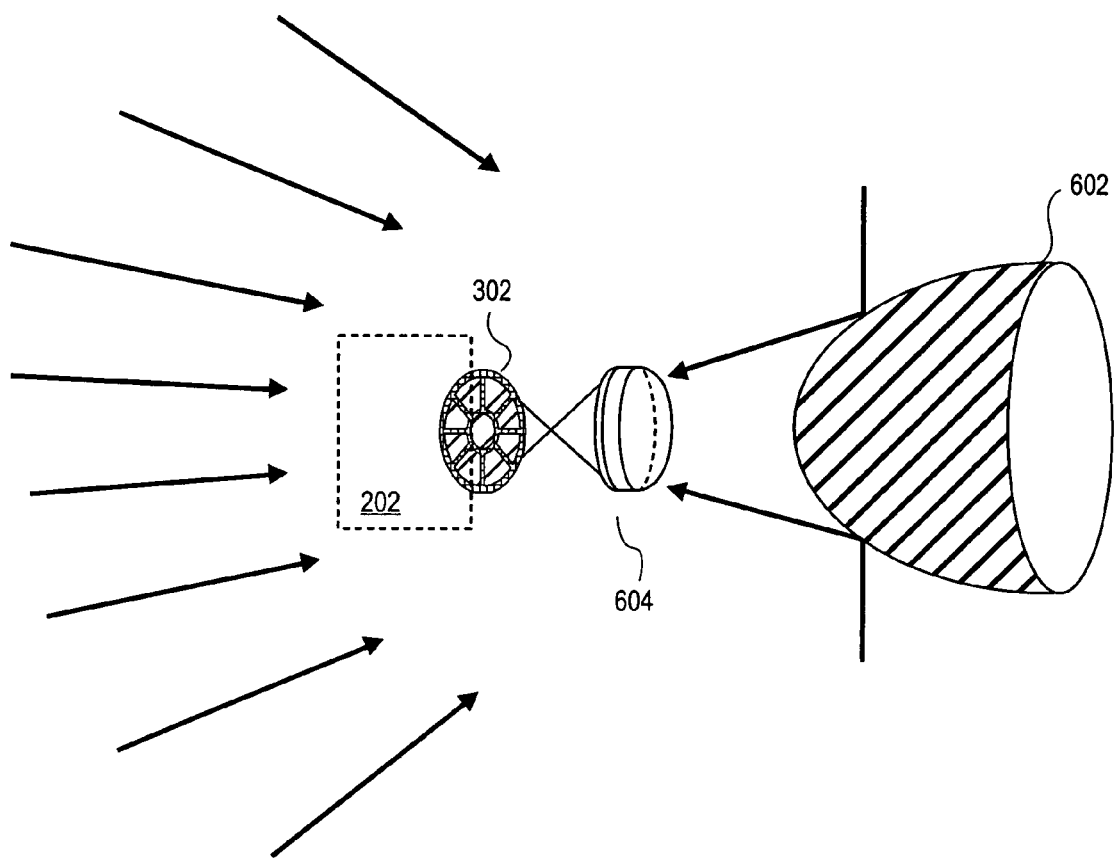

In order for the light detector elements 304 to detect light from the different optical zones of the environment, light from the environment must be focused onto multi-element sensor 202 from different angles including wide angles. FIGS. 4, 5, and 6 are diagrams illustrating different optical arrangements for focusing light onto multi-element sensor 202 including light detector elements 302. FIGS. 4, 5, and 6 are illustrated using arrangement 302. Additionally, the optical arrangements may be used with arrangement 310 illustrated in FIG. 3B As illustrated in FIG. 4, a wide angle refractive lens 402 is placed in front of multi-element sensor 202. Wide angle refractive lens 402 focuses the light from different angles in the environment including wide angles. Wide angle refractive lens 402 focuses the light from the environment on light detector elements 304 of multi-element sensor 202.

FIG. 5 is a diagram illustrating another optical arrangement for focusing light onto multi-element sensor 202. As illustrated in FIG. 5, a prismatic reflector 502 and a lens 504 focus light from the environment onto multi-element sensor 202. Multi-element sensor 202 is positioned in front of prismatic reflector 502 and lens 504. Prismatic reflector 502 reflects light from the environment onto lens 504. Lens 504 focuses the reflected light from prismatic reflector 502 onto multi-element sensor 202.

FIG. 6 is a diagram illustrating another optical arrangement for focusing light onto multi-element sensor 202. As illustrated in FIG. 6, a parabolic reflector 602 and a lens 604 focus light from the environment onto multi-element sensor 202. Multi-element sensor 202 is positioned in front of parabolic reflector 602 and lens 604. Parabolic reflector 602 reflects light from the environment onto lens 604. Lens 604 focuses the reflected light from parabolic reflector 602 onto multi-element sensor 202.

Figure 7:
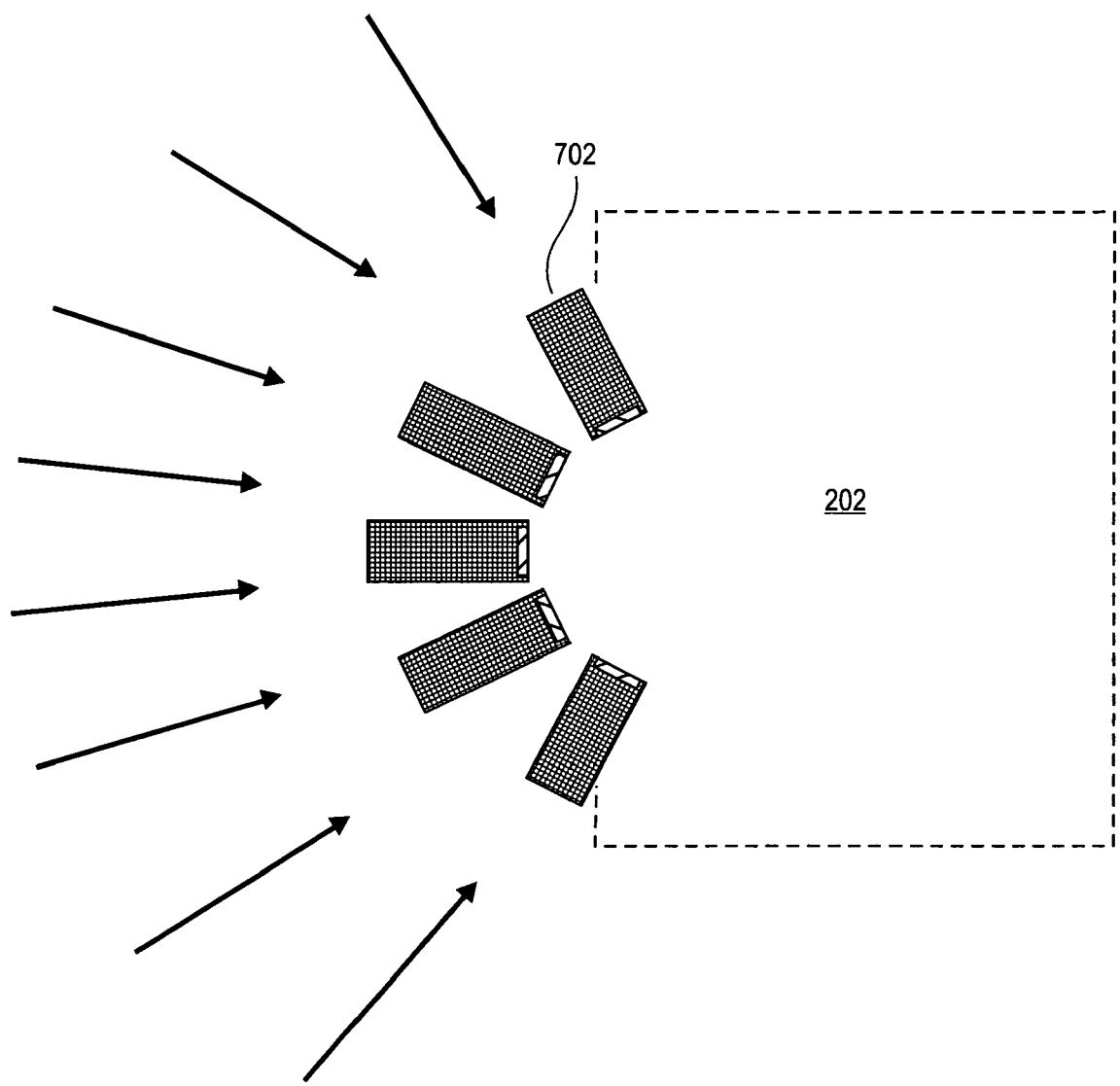
FIG. 7 is a diagram illustrating a multi-element sensor consistent with embodiments of the invention.

FIG. 7 illustrates a multi-element sensor 202 with discrete detector elements 702. As illustrated in FIG. 7, each discrete detector element 702 is directed at a different angle. As such, each discrete detector element 702 detects light from a different optical zone. FIG. 7 illustrates discrete detector elements 702 arranged at different angles in one plane. Discrete detector elements 702 may be arranged at different angles in multiple planes.

Each detector element 702 may be composed of narrow angle optics and light detector elements. Each detector element 702 may be composed of a single or multiple light detector elements. For example, each element may be composed of a single or multiple semiconductor light detectors such as photodiodes or reverse-biased photodiodes.

Returning to FIG. 2, light sensor 200 also includes a signal conditioner 204. Signal conditioner 204 may be any type of circuitry to modify the signal from multi-element light sensor 202 as required by light sensor 200. For example, signal conditioner 204 may be an amplifier for amplifying the signal from multi-element sensor 202. Signal conditioner 204 may also be a noise filter for removing noise from the signal from multi-element sensor 202. One skilled in the art will realize that the above examples of signal conditioner 204 are exemplary and signal conditioner 204 may be any type of hardware, software, or combination thereof to modify the signal from multi-element light sensor 202 as required by light sensor 200. Alternatively, light sensor 200 may not require a signal conditioner 204.

Light sensor 200 also includes an analog to digital converter (ADC) 206 coupled to the signal conditioner. If a signal conditioner 204 is not included in light sensor 200, ADC 206 is coupled directly to multi-element light sensor 202. ADC 206 may be any type of hardware, software, or combination thereof to convert signals from analog to digital.

Light sensor 200 also includes a processor 208 coupled to ADC 206. Processor 206 is coupled to a memory 210. Processor 206 may be any type of hardware, software, or combination thereof to receive signals from multi-element sensor 202 and perform processing on the signal. For example, processor 206 may be a digital signal processor (DSP). Memory 210 may be any type of memory capable of storing information. For example, memory 210 may be semiconductor media, such as DRAM, SRAM, EPROM, EEPROM, or memory stick.

Processor 208 in combination with memory 210 performs processing such as analyzing, manipulating, and storing signals from multi-element sensor 202. Additionally, processor 208 in combination with memory 210 may store the signals from sensor 202 as zone illumination information over a period of time.

Processor 208 would receive the signal from the different light detector elements in multi-element sensor 202 and store the signals from the respective light detectors as illumination information for that optical zone. Processor 208 in combination with memory 210 may store the optical zone illumination information over a period of time. For example, the optical zone illumination information may be stored for a period of time ranging from a few second to hours.

As described above, light sensor 200 may be used to determine the luminosity of a display in an electronic device. To determine the proper display luminosity, processor 208 may determine the characteristics of the environmental illumination using the optical zone illumination information. Processor 208 in combination with memory 210 may determine the spatial and temporal characteristics of the detected light. For example, processor 208 may determine spatial and temporal distributions of the detected light, spatial differentials of the detected light, the rate of change of the illumination levels in the optical zones, and temporal and spatial densities of the detected light.

In addition, processor 208 may model the behavior of the eye-brain system when exposed to the illumination conditions detected by multi-element light sensor 202. Processor 208 may use standard eye behavior models such as Ricco's law, Bloch's law, Weber's law, Broca-Sulzer effect, Ferry-Porter Law, and Brucke-Bartley Effect as described below. Also, viewer specific metrics such as eye mobility, tolerances to visual excitations, and time constants may be used.

Processor 208 and memory 210 may include the necessary hardware, software, or combination thereof to determine the characteristics of the environmental illumination as described above. For example, processor 208 or memory 210 may contain the necessary logic to perform the analyzing, manipulating, and storing of signals from multi-element sensor 202 to determine the characteristics of the environmental illumination.

Once determined, processor 208 may provide display driver 212 with information such as the characteristics of the environmental illumination. Display driver 212 may use the information to power the display at appropriate levels for the environmental illumination conditions. Also, processor 208 may generate a display driver signal based on the characteristics of the environmental illumination.

Figure 8:
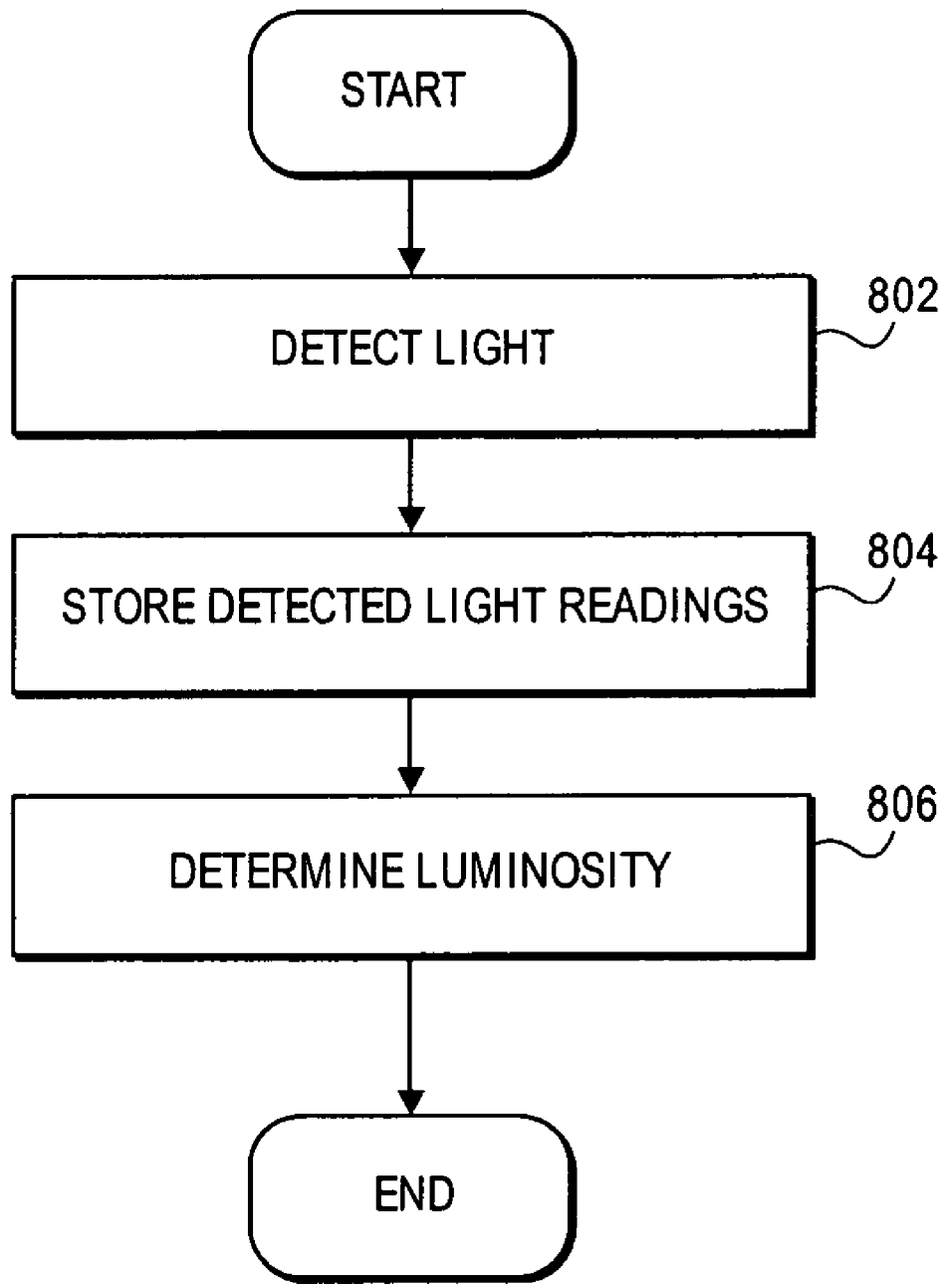
FIG. 8 is a diagram illustrating a method of sensing light consistent with embodiments of the invention.

FIG. 8 illustrates a method 800 for using light sensor 200 for detecting light consistent with embodiments. Light sensor 200 performs method 800 in combination with a device such as a television, cell phone, avionics device, camera, or computer display. Light sensor 200 performs method 800 to detect the environmental illumination conditions in which the electronic devices are located.

Method 800 begins with light sensor 200 detecting light from an environment by dividing the light into optical zones (stage 802). By dividing the environment into optical zones, light sensor 200 may detect the environmental illumination conditions for the different optical zones. Light sensor may divide the light into optical zones using multi-element light detector 202 such the example of multi-element light detector 202 illustrated in FIGS. 3A, 3B, 4, 5, 6, and 7.

Next, light sensor 200 stores the detected light as historic light readings for the optical zones (stage 804). Specifically, the light detected by multi-element light detector 202 is transferred to processor 208. Processor 208 transfers the detected light signal into memory 210.

Then, light sensor 200 determines a luminosity of a light source based on the historic light readings (stage 805). For example, processor 208 may determine characteristics of the environmental illumination based on the detected light. Then, processor 208 sends a signal to display driver 212 so that display driver 212 may power the display at the appropriate levels for the environmental illumination conditions.

Light sensor 200 may determine various characteristics of the environmental illumination conditions. Light sensor 200 may determine the spatial characteristics of the environmental illumination conditions. Light sensor 200 may determine the spatial characteristics by comparing the light detected from the multiple light detector elements, which represent the optical zones. For example, the light sensor may determine the spatial distribution of light, spatial differentials of the environmental illumination conditions, and the spatial density of the environmental illumination conditions.

Further, light sensor 200 may use the historic data to determine temporal characteristics of the environmental illumination conditions. Light sensor 200 may determine the temporal characteristics by comparing the light detected from the multiple light detector elements, which represent the optical zones, over time. For example, light sensor 200 may determine the rate of change in the illumination levels of each optical zone. Also, the historic data may be used to determine the spatial characteristics of the environmental illumination conditions over time.

Further, light sensor 200 may use the environmental illumination conditions to determine the behavior of the human eye to these conditions. Light sensor 200 may apply the environmental illumination conditions, the temporal characteristics, and the spatial characteristics to a model of human eye behavior. Light sensor 200 may use such models as Ricco's law, Bloch's law, Weber's law, Broca-Sulzer effect, Ferry-Porter Law, and Brucke-Bartley Effect as described below. Each of these models may be used to determine the effect of a condition of the environment illumination effect on the human eye.

To accommodate both sensitivity and resolution, the human eye developed two overlapping (duplex) sensory networks: one for high sensitivity and the other for increased resolution. The high sensitivity network consists of a mesh of rods (photoreceptor cells in the retina) and ganglion cells (neurons located in the retina of the eye attached to photoreceptor cells) with large receptive fields. The vision provided by this network is known as scotopic vision. Scotopic vision dominates the way we see at night.

The second network has a much higher percentage of cones (cells in the eye retina of the eye which function in relative bright light and detect color) than rods. The cones are associated with ganglion cells with very small receptive fields. Vision using this network is called photopic vision. Photopic vision provides most of our visual input under bright light conditions.

The human eye contains over 130 million photoreceptors. The photoreceptors are roughly divided between 3 million L (red) cones, 3 million M (green) cones, and only 1 million S (blue) cones, with the balance consisting of achromatic rods. At the center of the macula (center of the retina), we find mostly cones—about 150,000 of them packed into an area of one square millimeter.

Since cones occupy most of the macula, photopic visual acuity is associated mostly with the cones. The low density of S cones also indicates that our eyes have a much lower resolution for blue color detail. Still, the brain integrates the S cone signals into a continuous blue image which explains why gaps do not appear when observing a blue object.

Ricco's law concerns the relationship between size of an object and the threshold illumination level needed to perceive the object. As it gets darker, humans have more and more difficulty reading small print and distinguishing small object. For a quantitative evaluation of Ricco's law, objects are standardized to a set of small white disks of different areas. For a fixed period of time, the threshold intensity, I, is inversely proportional to the area, A, of the disk. The relationship between the threshold intensity and area is known as Ricco's Law of Spatial Summations:

$$I * A = \text{constant}$$

The retinal response is an integral or summation of the photon flux over small retinal areas. In relative darkness, the threshold response disk area spans a 0.5 degree angle, while under good lighting condition the angle is found to be 0.06 degrees. Past a certain disk size (known as the area of complete summation), the threshold light intensity remains constant, which may indicate a dynamic pixilation of the retina. Once a certain object detail size is reached, that size becomes a pixel equivalent for the rest of the visual processing chain.

There is considerable evidence that each area of complete summation is processed by single ganglion cell. The area of complete summation quantifies the two-dimensional resolution of the eye. In good lighting conditions, the eye's one-dimensional (line to line) threshold response may be up to three times better (approximately 0.02 degrees) than its two-dimensional performance. This may possibly be due to signal processing inference rather than eye optics.

According to Ricco's law, high convergence areas of the retina (large receptive fields) correspond to high sensitivity. In other words, the larger the receptive filed, the lower the intensity threshold. In low convergence areas, the size of individual receptive fields is significantly smaller. Because these fields are closely packed, the resolution of the eye is much higher, but the intensity threshold increases accordingly.

Bloch's law describes behavior when disk sizes and intensity level are kept constant, but the duration of each observation is varied. The time, T, it takes to perceive an object of a given (small) size is in inverse proportion to the luminosity, I, on that object. The relationship between I and T is given by Bloch's law:

$$I*T=\text{constant}$$

When the duration is increased past a critical value (called the duration of complete summation), the threshold intensity becomes constant. For rods, Bloch's law levels off at about 100 milliseconds. For cones, Bloch's law levels off after 50 milliseconds.

The formal similarity between Ricco's law and Bloch's law suggests that threshold intensity level may be determined by the total energy of the photons contributed to a ganglion cell, regardless if it is obtained by summation over time or integration over local retinal area.

The receptive fields associated with ganglion cells are not all the same, but the most common type is the center-surround receptive field. The center-surround receptive field's distinguishing feature is the presence of two distinct concentric subfields with opposite stimuli responses: a center circle and a doughnut. Subfields may be center-on/doughnut-off and center-off/doughnut-on fields. The center-on/doughnut-off field responds stronger when the center is illuminated more than the periphery. The center-off/doughnut-on responds stronger when the periphery is illuminated more.

This arrangement makes the associated ganglion cell indifferent to uniform illumination but sensitive to high illumination gradients. High illumination gradient may be found in high-contrast images or around the edges of objects. Weber's law describes what happens when an illumination gradient $\Delta I$ is superimposed on top of a uniform illumination $I_o$. Weber's law states that a minimally noticeable change in light intensity is a constant proportion of the background intensity.

$$\Delta I/I_o=\text{constant}$$

An object illuminated by a local source shows more detail when placed against a dark background than when placed against a well-lit background. This phenomenon is known as lightness constancy. However, when both the object and the background are illuminated by the same source the degree of detail evidenced by the object is the same regardless of scene illumination (for the same background). In this case, both $\Delta I$ and $I_o$ are the result of surface reflectance. As such, the object's and background's ratio remains the same for all illumination levels. This effect is known as lightness contrast. A related parameter is maximum linear eye resolution which, under photopic conditions, is found to be about 0.02 degrees.

An interesting side effect of Bloch's law is the Broca-Sulzer effect. The Broca-Sulzer occurs when the eye is exposed to bright flashes of light comparable in length to the Bloch critical duration (50 to 100 milliseconds). Under these conditions, a normalized decay follows a transient apparent amplification of the intensity of the light. A secondary gain mechanism appears during the temporal summation period that subsides when the summation is complete. This effect mimics a transient response of an under-damped feedback system.

The critical flicker frequency (CFF) is a frequency value of an alternating illumination source above which the light appears to be continuous. Many factors influence our perception of flicker. One factor is the size of the light source. A large light source as a TV monitor may not exhibit flicker when viewed directly. The flicker may be quite pronounced if viewed at an angle. This occurrence suggests a higher CFF for the peripheral retina (rod-dominated) than for the macula (cone-dominated).

CFF is also higher for larger objects than for smaller ones. Humans may also be trained to tolerate flicker. For example, Europe uses 50 Hz Pal monitors. Although most Europeans do not see the flicker, many visitors who grew up watching 60 Hz NTSC monitors are quite aware of flicker in the 50 Hz monitors.

According to the Ferry-Porter law, the CFF is a linear function of the logarithm of the source luminance, I:

$$CFF=A\log(I)+B$$

where A and B are constants.

The Ferry-Porter law indicates that the higher the light intensity is, the higher the CFF. In other words, for a given stimulus frequency, the lower the intensity, the lower the CFF. The flickering of a Pal monitor, for example, becomes less evident if the luminosity is lowered or if the monitor is moved into a well-lit area (unless the area's lights are also powered by a 50 Hz frequency power source).

Above CFF, there is not a distinction between the perceived luminosity of a continuous source and that of an intermittent source of equivalent emissive power. The Talbot Plateau law sets forth this effect.

The perceived brightness of a source operating below CFF is significantly higher then the brightness of an equivalent continuous source (Brucke-Bartly effect). Peak perceived brightness is reached when the "on" time of the flicker approaches the Bloch critical duration. This explains the high effectiveness of colored flashing warning signs operating in the 15 to 20 Hz range. The Brucke-Bartly effect is a steady state variation of the Broca-Sulzer effect discussed earlier.

However, this maximum sensitivity peak holds only for photopic (cone-dominated) vision. Then, the CFF is close to a familiar 60 Hz and the flicker contrast threshold is around 1 percent. For scotopic vision, the CFF drops to 15 Hz and the contrast threshold increase to 20 percent.

To account for all these effects a general function for the compensated output of a display can be written as:

$$O(t)=f[[I_i(t),[I_i(t)-I_j(t)],[I_i(t)-I_i(t_k)]])]$$

Where $O(t)$ is the display output at time t, $I_i(t)$ is the ambient light intensity seen by element i at time t, $I_j(t)$ is the ambient light intensity seen by element j at time t, and $I_i(t_k)$ is the ambient light intensity seen by element i at a past time $t_k$. To a linear approximation this expression can be reduced to:

$$O(t)=\Sigma_i\alpha_i I_i(t)+\Sigma_i\Sigma_j\beta_{i,j}[I_i(t)-I_j(t)]+\Sigma_i\Sigma_k\gamma_{i,k}[I_i(t)-I_i(t_k)])]$$

Where the summations occur across elements (i,j) and across time (k), and the coefficients $\alpha_i$, $\beta_{i,j}$, and $\gamma_{i,k}$ are empirical in nature and depend on the characteristics of the user. The above approximation concerns the environmental lighting condition of ambient light intensity. One skilled in the art will realize that the above approximation may be used with other environmental lighting conditions. Further, one skilled in the art will realize that the above linear approximation is exemplary and that higher order non-linear approximations or other approximations or other models may also be used.

The execution of the above model may be performed by any hardware, software, or combination thereof, such as a microprocessor, a field programmable gate array (FPGA), or by other hardware, firmware, or software methods.

For example, processor 208 in combination memory may determine the eye's responses to the environmental illumination conditions as a linear combination such as the above approximation. Processor 208 would apply the illumination information from multi-element sensor 202 to the models mentioned above to determine the eyes response to such conditions. The linear combination of this information would be used to determine the driving signal of a display device. Processor 208 may use various conditions such as contrast and intensity to determine the eyes response.

Also, light sensor 200 may use viewer specific metrics such as eye mobility, tolerances to visual excitations, and time constants. These metrics may be standard for a typical user or these metrics may be programmed into light sensor for a particular user.

Other embodiments will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A sensor comprising:
   a light detector for dividing light in an environment into optical zones and detecting light from the optical zones;
   a processor coupled to the light detector, wherein the processor is configured to determine spatial and temporal characteristics of the detected light, including a rate of change of an illumination level in the optical zones over time; and
   a memory coupled to the processor for storing the spatial and temporal characteristics of the detected light and the rate of change of the illumination level in the optical zones over time as historic light readings.

2. The detector of claim 1, wherein the light sensor comprises:
   a wide angle optic for capturing the light at wide angles in the environment; and
   a multi-element light detector positioned adjacent to the wide angle optic for detecting the light in the optical zones.

3. The detector of claim 2, wherein the wide angle optic comprises:
   a wide angle refractive optic for capturing the light at wide angles in the environment and for focusing the light on the multi-element light detector.

4. The detector of claim 2, wherein the wide angle optic comprises:
   a prismatic reflector for capturing the light at wide angles in the environment; and
   a lens positioned adjacent to the prismatic reflector for focusing the on the multi-element light detector.

5. The detector of claim 2, wherein the wide angle optic comprises:
   a parabolic reflector for capturing the light at wide angles in the environment; and
   a lens positioned adjacent to the parabolic reflector for focusing the light on the multi-element light detector.

6. The detector of claim 1, wherein the light detector comprises:
   narrow angle optics arranged to capture the light at wide angles in the environment; and
   narrow angle light detector positioned adjacent to the narrow angle optics for detecting the light in the optical zones.

7. The detector of claim 1, wherein the processor comprises:
   logic for retrieving the historic light readings from the memory; and
   logic for determining a luminosity of a light source based on a model of eye behavior and on the historic ambient light readings.

8. The detector of claim 7, wherein the processor further comprises:
   logic for producing a display light source control signal based on the determined luminosity.

9. The detector of claim 1, wherein the processor comprises:
   logic for determining spatial characteristics of the light in the optical zones; and
   logic for producing a display light source control signal based on the determined spatial characteristics.

10. The detector of claim 1, wherein the processor comprises:
    logic for determining temporal characteristics of the light in the optical zones; and
    logic for producing a display light source control signal based on the determined temporal characteristics.

11. A method for detecting light, comprising:
    detecting light from an environment by dividing the light into optical zones;
    determining spatial and temporal characteristics of the detected light, including a rate of change of an illumination level in the optical zones over time;
    storing the spatial and temporal characteristics of the detected light and the rate of change of the illumination level in the optical zones over time as historic light readings for the optical zones; and
    determining a luminosity of a light source based on the historic light readings.

12. The method of claim 11, further comprising:
    producing a display light source control signal based on the determined luminosity.

13. The method of claim 11, wherein determining the luminosity of the light source, comprises:
    determining the luminosity of the light source by applying the historic light readings to an eye behavior model.

14. A sensor comprising:
    means for dividing an ambient environment into optical zones;
    means for detecting light from the optical zones positioned adjacent to the dividing means;
    means for processing the detected light coupled to the detecting means;
    means for storing the detected light as historic light readings coupled to the processing means;
    means for retrieving the historic light readings from the storing means; and
    means for determining a luminosity of a light source based on a model of eye behavior and on the historic light readings.

15. The sensor of claim 14, wherein the processing means further comprises:
    means for determining spatial characteristics of the detected light; and
    means for determining a luminosity of a light source based on the spatial characteristics.

16. The sensor of claim 14, wherein the processing means further comprises:

means for determining temporal characteristics of the detected light; and means for determining a luminosity of a light source based on the temporal characteristics.

17. The detector of claim 7, wherein the model of eye behavior includes Ricco's law, Bloch's law, Weber's law, Broca-Sulzer effect, Ferry-Porter Law, and Brucke-Bartley Effect.

18. The method of claim 13, wherein the eye behavior model includes Ricco's law, Bloch's law, Weber's law, Broca-Sulzer effect, Ferry-Porter Law, and Brucke-Bartley Effect.

19. The sensor of claim 14, wherein the model of eye behavior includes Ricco's law, Bloch's law, Weber's law, Broca-Sulzer effect, Ferry-Porter Law, and Brucke-Bartley Effect.

20. The detector of claim 16, wherein the luminosity of the light source is used to determine a driving signal of a display device.

21. The sensor of claim 14, wherein the luminosity of the light source is used to determine a driving signal of a display device.

* * * * *